US011775442B2

(12) United States Patent
Shah et al.

(10) Patent No.: US 11,775,442 B2
(45) **Date of Patent: *Oct. 3, 2023**

(54) MEMORY SYSTEM WITH A PREDICTABLE READ LATENCY FROM MEDIA WITH A LONG WRITE LATENCY

(71) Applicant: Microsoft Technology Licensing, LLC, Redmond, WA (US)

(72) Inventors: Monish Shantilal Shah, Sammamish, WA (US); John Grant Bennett, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 88 days.

This patent is subject to a terminal disclaimer.

(21) Appl. No.: 17/583,831

(22) Filed: Jan. 25, 2022

(65) Prior Publication Data

US 2022/0147461 A1 May 12, 2022

Related U.S. Application Data

(63) Continuation of application No. 16/884,217, filed on May 27, 2020, now Pat. No. 11,269,779.

(51) Int. Cl.
*G06F 12/08* (2016.01)
*G06F 12/0895* (2016.01)
*G06F 11/10* (2006.01)

(52) U.S. Cl.
CPC ...... *G06F 12/0895* (2013.01); *G06F 11/1004* (2013.01); *G06F 2212/1024* (2013.01)

(58) Field of Classification Search
CPC ............. G06F 12/0895; G06F 11/1004; G06F 2212/1024
See application file for complete search history.

*Primary Examiner* — Charles Rones
*Assistant Examiner* — Han V Doan
(74) *Attorney, Agent, or Firm* — Ranjeev Singh; Singh Law, PLLC

(57) ABSTRACT

Systems and methods related to a memory system with a predictable read latency from media with a long write latency are described. An example memory system includes an array of tiles configured to store data corresponding to a cache line associated with a host. The memory system further includes control logic configured to, in response to a write command from a host, initiate writing of a first cache line to a first tile in a first row of the tiles, a second cache line to a second tile in a second row of the tiles, a third cache line to a third tile in a third row of the tiles, and a fourth cache line in a fourth row of the tiles. The control logic is configured to, in response to a read command from the host, initiate reading of data stored in an entire row of tiles.

20 Claims, 13 Drawing Sheets

| DEC0 | T00 | T01 | T02 | T03 | T04 | T05 | T06 | T07 |
|---|---|---|---|---|---|---|---|---|
| DEC1 | T10 | T11 | T12 | T13 | T14 | T15 | T16 | T17 |
| DEC2 | T20 | T21 | T22 | T23 | T24 | T25 | T26 | T27 |
| DEC3 | T30 | T31 | T32 | T33 | T34 | T35 | T36 | T37 |
| DEC4 | T40 | T41 | T42 | T43 | T44 | T45 | T46 | T47 |
| DEC5 | T50 | T51 | T52 | T53 | T54 | T55 | T56 | T57 |
| DEC6 | T60 | T61 | T62 | T63 | T64 | T65 | T66 | T67 |
| DEC7 | T70 | T71 | T72 | T73 | T74 | T75 | T76 | T77 |

400

| DEC0 | T00 | T01 | T02 | T03 | T04 | T05 | T06 | T07 |
|---|---|---|---|---|---|---|---|---|
| DEC1 | T10 | T11 | T12 | T13 | T14 | T15 | T16 | T17 |
| DEC2 | T20 | T21 | T22 | T23 | T24 | T25 | T26 | T27 |
| DEC3 | T30 | T31 | T32 | T33 | T34 | T35 | T36 | T37 |
| DEC4 | T40 | T41 | T42 | T43 | T44 | T45 | T46 | T47 |
| DEC5 | T50 | T51 | T52 | T53 | T54 | T55 | T56 | T57 |
| DEC6 | T60 | T61 | T62 | T63 | T64 | T65 | T66 | T67 |
| DEC7 | T70 | T71 | T72 | T73 | T74 | T75 | T76 | T77 |

| DEC0 | T00 | T01 | T02 | T03 | T04 | T05 | T06 | T07 | T08 |
|---|---|---|---|---|---|---|---|---|---|
| DEC1 | T10 | T11 | T12 | T13 | T14 | T15 | T16 | T17 | T18 |
| DEC2 | T20 | T21 | T22 | T23 | T24 | T25 | T26 | T27 | T28 |
| DEC3 | T30 | T31 | T32 | T33 | T34 | T35 | T36 | T37 | T38 |
| DEC4 | T40 | T41 | T42 | T43 | T44 | T45 | T46 | T47 | T48 |
| DEC5 | T50 | T51 | T52 | T53 | T54 | T55 | T56 | T57 | T58 |
| DEC6 | T60 | T61 | T62 | T63 | T64 | T65 | T66 | T67 | T68 |
| DEC7 | T70 | T71 | T72 | T73 | T74 | T75 | T76 | T77 | T78 |

| DEC0 | T00 | T01 | T02 | T03 | T04 | T05 | T06 | T07 | T08 |
|---|---|---|---|---|---|---|---|---|---|
| DEC1 | T10 | T11 | T12 | T13 | T14 | T15 | T16 | T17 | T18 |
| DEC2 | T20 | T21 | T22 | T23 | T24 | T25 | T26 | T27 | T28 |
| DEC3 | T30 | T31 | T32 | T33 | T34 | T35 | T36 | T37 | T38 |
| DEC4 | T40 | T41 | T42 | T43 | T44 | T45 | T46 | T47 | T48 |
| DEC5 | T50 | T51 | T52 | T53 | T54 | T55 | T56 | T57 | T58 |
| DEC6 | T60 | T61 | T62 | T63 | T64 | T65 | T66 | T67 | T68 |
| DEC7 | T70 | T71 | T72 | T73 | T74 | T75 | T76 | T77 | T78 |

| DEC0 | T00 | T01 | T02 | T03 | T04 | T05 | T06 | T07 | T08 |
|---|---|---|---|---|---|---|---|---|---|
| DEC1 | T10 | T11 | T12 | T13 | T14 | T15 | T16 | T17 | T18 |
| DEC2 | T20 | T21 | T22 | T23 | T24 | T25 | T26 | T27 | T28 |
| DEC3 | T30 | T31 | T32 | T33 | T34 | T35 | T36 | T37 | T38 |
| DEC4 | T40 | T41 | T42 | T43 | T44 | T45 | T46 | T47 | T48 |
| DEC5 | T50 | T51 | T52 | T53 | T54 | T55 | T56 | T57 | T58 |
| DEC6 | T60 | T61 | T62 | T63 | T64 | T65 | T66 | T67 | T68 |
| DEC7 | T70 | T71 | T72 | T73 | T74 | T75 | T76 | T77 | T78 |

| DEC0 | T00 | T01 | T02 | T03 | T04 | T05 | T06 | T07 | T08 |
|---|---|---|---|---|---|---|---|---|---|
| DEC1 | T10 | T11 | T12 | T13 | T14 | T15 | T16 | T17 | T18 |
| DEC2 | T20 | T21 | T22 | T23 | T24 | T25 | T26 | T27 | T28 |
| DEC3 | T30 | T31 | T32 | T33 | T34 | T35 | T36 | T37 | T38 |
| DEC4 | T40 | T41 | T42 | T43 | T44 | T45 | T46 | T47 | T48 |
| DEC5 | T50 | T51 | T52 | T53 | T54 | T55 | T56 | T57 | T58 |
| DEC6 | T60 | T61 | T62 | T63 | T64 | T65 | T66 | T67 | T68 |
| DEC7 | T70 | T71 | T72 | T73 | T74 | T75 | T76 | T77 | T78 |

| DEC0 | T00 | T01 | T02 | T03 | T04 | T05 | T06 | T07 | T08 |
|---|---|---|---|---|---|---|---|---|---|
| DEC1 | T10 | T11 | T12 | T13 | T14 | T15 | T16 | T17 | T18 |
| DEC2 | T20 | T21 | T22 | T23 | T24 | T25 | T26 | T27 | T28 |
| DEC3 | T30 | T31 | T32 | T33 | T34 | T35 | T36 | T37 | T38 |
| DEC4 | T40 | T41 | T42 | T43 | T44 | T45 | T46 | T47 | T48 |
| DEC5 | T50 | T51 | T52 | T53 | T54 | T55 | T56 | T57 | T58 |
| DEC6 | T60 | T61 | T62 | T63 | T64 | T65 | T66 | T67 | T68 |
| DEC7 | T70 | T71 | T72 | T73 | T74 | T75 | T76 | T77 | T78 |

| DEC0 | T00 | T01 | T02 | T03 | T04 | T05 | T06 | T07 | T08 | DEC0A |
| --- | --- | --- | --- | --- | --- | --- | --- | --- | --- | --- |
| DEC1 | T10 | T11 | T12 | T13 | T14 | T15 | T16 | T17 | T18 | DEC1A |
| DEC2 | T20 | T21 | T22 | T23 | T24 | T25 | T26 | T27 | T28 | DEC2A |
| DEC3 | T30 | T31 | T32 | T33 | T34 | T35 | T36 | T37 | T38 | DEC3A |
| DEC4 | T40 | T41 | T42 | T43 | T44 | T45 | T46 | T47 | T48 | DEC4A |
| DEC5 | T50 | T51 | T52 | T53 | T54 | T55 | T56 | T57 | T58 | DEC5A |
| DEC6 | T60 | T61 | T62 | T63 | T64 | T65 | T66 | T67 | T68 | DEC6A |
| DEC7 | T70 | T71 | T72 | T73 | T74 | T75 | T76 | T77 | T78 | DEC7A |

MEMORY SYSTEM WITH A PREDICTABLE READ LATENCY FROM MEDIA WITH A LONG WRITE LATENCY

CROSS-REFERENCE TO RELATED APPLICATION(S)

This application is a continuation of U.S. patent application Ser. No. 16/884,217, filed on May 27, 2020, entitled "MEMORY SYSTEM WITH A PREDICTABLE READ LATENCY FROM MEDIA WITH A LONG WRITE LATENCY," the entire contents of which are hereby incorporated herein by reference.

BACKGROUND

Traditional computing systems include a CPU that may be coupled to a memory system. The CPU performs read/write operations on the memory to access the data stored in the memory system. As part of these operations, the CPU may issue commands to the memory via a memory controller associated with the memory system. As an example, a write command may provide an address and data for writing to the memory, and a read command may provide an address for reading data from the memory. A memory system may include a non-volatile memory with memory cells that require more time to perform write operations than the time required to perform read operations. The amount of time required to perform the write operation or the read operation may vary depending on the nature of the memory cells.

SUMMARY

In one example, the present disclosure relates to a memory system. The memory system may include at least one array of N rows of tiles and M columns of tiles, where each of N and M is an integer, where each of the tiles is configured to store data corresponding to at least one cache line associated with a host, and where each of the tiles comprises memory cells. The memory system may further include control logic.

The control logic may be configured to, in response to a write command from a host, initiate writing of a first cache line to a first tile in a first row of the N rows of tiles, a second cache line to a second tile in a second row of the N rows of tiles, a third cache line to a third tile in a third row of the N rows of tiles, and a fourth cache line in a fourth row of the N rows of tiles, and thereby allowing at least N cache lines to be written in response to the write command from the host. The control logic may further be configured to, in response to a read command from the host, initiate reading of data stored in an entire row of tiles, and thereby allowing at least M cache lines to be read in response to the read command from the host.

In another example, the present disclosure relates to a memory system. The memory system may include at least one array of N rows of tiles and M columns of tiles, where each of N and M is an integer, where each of the tiles is configured to store data corresponding to at least one cache line associated with a host, and where each of the tiles comprises non-volatile memory cells. The memory system may further include control logic.

The control logic may be configured to, in response to a write command from the host, initiate writing of a first cache line to a first tile in a first row of the N rows of tiles, a second cache line to a second tile in a second row of the N rows of tiles, a third cache line to a third tile in a third row of the N rows of tiles, and a fourth cache line in a fourth row of the N rows of tiles, and thereby allowing at least N cache lines to be written in response to the write command from the host, and generate a first bit-wise parity for tiles in the first row of the N rows of tiles, a second bit-wise parity for tiles in the second row of the N rows of tiles, a third bit-wise parity for tiles in the third row of the N rows of tiles, and a fourth bit-wise parity for tiles in the fourth row of the N rows of tiles. The control logic may further be configured to, in response to a read command from the host, initiate reading of data stored in an entire row of tiles, and thereby allowing at least M cache lines to be read in response to the read command from the host.

In yet another example, the present disclosure relates to a memory system. The memory system may include at least one array of N rows of tiles and M columns of tiles, where each of N and M is an integer, where each of the tiles is configured to store data corresponding to at least one cache line associated with a host, and where each of the tiles comprises non-volatile memory cells. The memory system may further include control logic.

The control logic may be configured to, in response to a read command from the host attempting to read data from a selected tile, initiate reading of data stored in one row of the N rows of tiles, except for the selected tile from among the tiles in the one row of the N rows of tiles, while completing writing of data to the selected tile from among the tiles in the one row of the N rows of tiles. The control logic may further be configured to, in response to the read command from the host, initiate reconstruction of data stored in the selected tile from among the tiles in the one row of the N rows of tiles using data from the tiles in the one row of the N rows of tiles, except for data from the selected tile, and the parity bits corresponding to the one row of the N rows of tiles being read in response to the read command from the host.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 4 shows a diagram of a bank of a memory in accordance with one example;

FIG. 5 shows a diagram of a bank of a memory in accordance with one example;

FIGS. 6A and 6B show diagrams illustrating the rotation of parity bits as part of a bank of a memory in accordance with one example;

FIG. 7 shows a diagram of a bank of a memory in accordance with one example;

FIG. 8 shows a diagram of a bank of a memory in accordance with one example;

FIG. 9 shows a diagram of a bank of a memory in accordance with one example;

DETAILED DESCRIPTION

Figure 1:
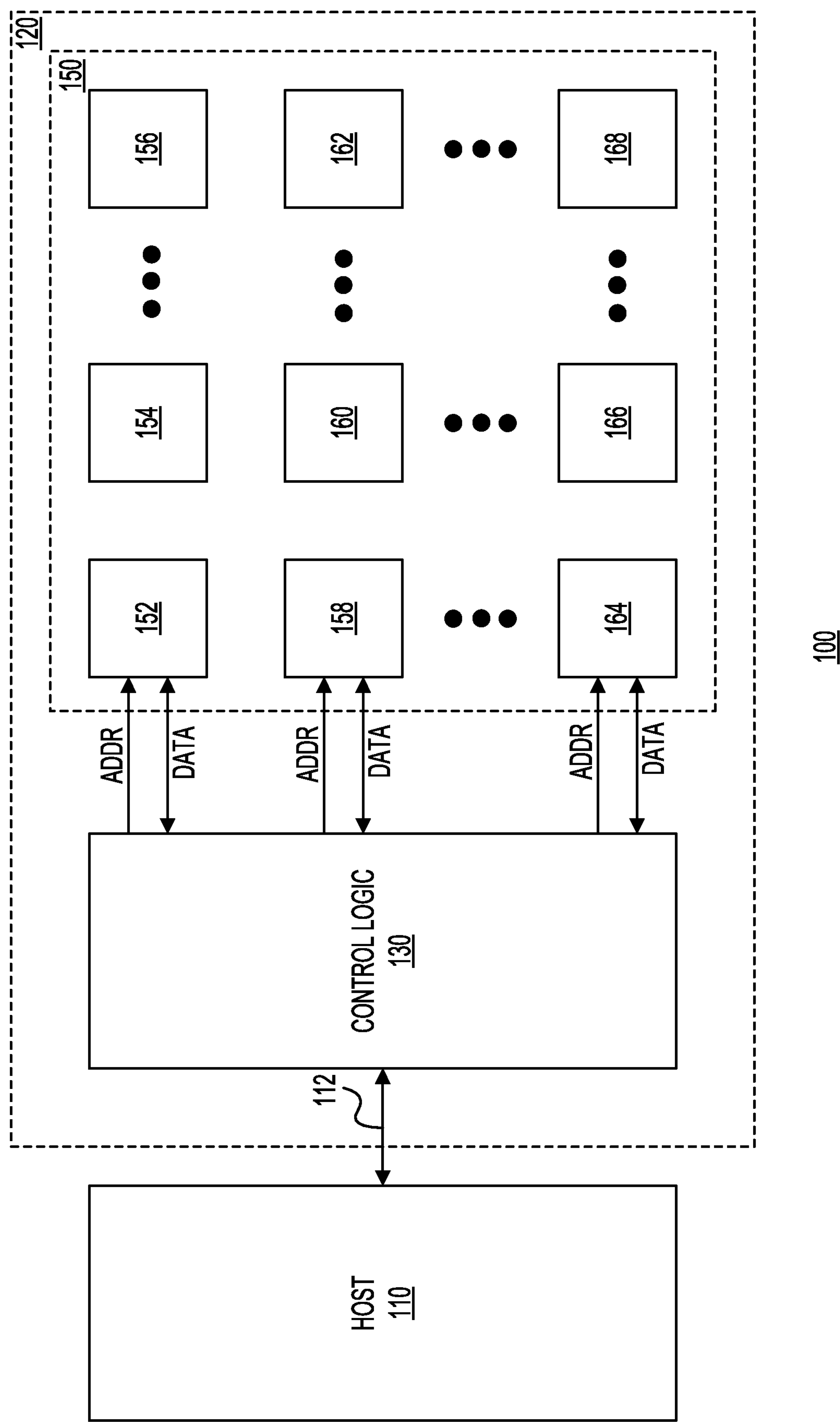
FIG. 1 shows a diagram of a system including a memory system in accordance with one example.

Examples described in this disclosure relate to a memory system with a predictable read latency from media with a long write latency. Certain examples relate to a memory system for reading and writing of cache lines associated with a host. Certain examples relate to a memory having arrays of tiles organized in rows and columns. In such a memory, a single cache line write operation may cause a write operation to multiple tiles associated with the memory. Certain examples relate to writing multiple cache lines in a similar amount of time as it would require writing a single cache line.

Dynamic random-access memory (DRAM) is the dominant choice for use as the main memory in most computer systems. A DRAM is typically coupled to a host, such as a CPU, a GPU, or another type of processor for providing volatile memory storage for programs and data. However, the semiconductor technology associated with DRAM is not scaling as well as other semiconductor technologies. Therefore, alternative memory technologies are being investigated as possible replacements. In many of these memory technologies, the write operations take a much longer time than the read operations. This, in turn results in an unpredictable read latency because of the long write latency associated with media corresponding to such memory technologies. Further, in many of the memory technologies, reading the memory may not be possible when it is being written to. Thus, if a read operation follows a write operation, it may encounter a long latency compared to the normal read latency. As an example, a write operation for a NAND flash memory requires erasing and programming a memory cell, and thus the write operation takes a longer time than the read operation. In sum, in these memory technologies the read operations experience tail latency when they follow any write operation.

Certain examples described herein are directed at improving the performance of memory technologies that are characterized by write operations that take a longer time than the read operations. Example memory technologies include, but are not limited to, non-volatile memory technologies and quasi-volatile memory technologies such as flash memory (e.g., NAND flash), ferroelectric random-access memory (FeRAM), magnetic random-access memory (MRAM), phase-change memory (PCM), and resistive random-access memory (RRAM). Broadly speaking, the present disclosure relates to any memory technology that includes a write operation that takes a longer time to perform than a read operation. While most memory technologies in which the write operation takes a longer time to perform include a non-volatile memory, certain memory systems including a volatile memory may also be susceptible to this issue. In this description, some examples assume a memory system with a 100 nano-second (ns) read time and a 1 micro-second (μs) write time. Certain examples accomplish such improvements by treating the write operations and the read operations differently in terms of which tiles are processed in response to a command from the host. Certain examples further relate to a system in which the unit of access for read or write operations is commensurate with a cache line associated with the host coupled to the memory.

FIG. 1 shows a diagram of a system 100 including a memory system 120 in accordance with one example. The address information may be used to select a memory location on the chip. The address terminals may be used for both row and column address selection by asserting the row and column addresses in a multiplexed fashion. The number and organization of address terminals and core banks may depend on the memory's size and organization. The address information may correspond to a read or a write operation. In response to a read operation, memory system 120 may provide data via bus 112 to host 110. A write operation may result in data being provided to memory system 120 by host 110 via bus 112. Memory system 120 may include control logic 130 and a memory 150, including a number of memory cells, organized in a group (e.g., banks). Thus, in this example, memory 150 may include banks 152, 154, 156, 158, 160, 162, 164, 166, and 168. Each bank may further include a number of groups of memory cells. In this example, each bank may include a number of tiles.

With continued reference to FIG. 1, control logic 130 may include logic to perform at least some or all of the following functions: (1) receive external commands from host 110, (2) provide incoming addresses to decoders associated with memory system 120, (3) transfer incoming data to a respective bank, (4) receive data from a bank, (5) coordinate read and write operations with the decoders associated with each bank, (6) generate bank specific addresses and provide those to the decoders associated with each bank, and (7) in case of a write operation, provide data to be written and in case of a read operation, receive data previously written at that location. Control logic 130 in combination with circuitry associated with the banks of the memory may be configured to perform any of the operations described further. Although FIG. 1 shows a certain number of components of system 100 and memory system 120 arranged in a certain manner, each of system 100 and memory system 120 could include more or fewer number of components arranged differently. As an example, although FIG. 1 describes memory 150 as having banks, memory 150 need not include banks. Instead, the memory cells may be organized in rows and columns. In other examples, the memory cells may be organized in groups other than banks. Moreover, banks, when used, may be organized into bank groups. In addition, control logic 130 may be integrated with memory 150 as part of memory system 120 in various ways. One way may be to form control logic 130 on the same die as memory 150. Alternatively, control logic 130 may be integrated by tightly coupling the logic with memory 150. Additional details concerning other implementations are described with respect to FIG. 3.

Figure 2:
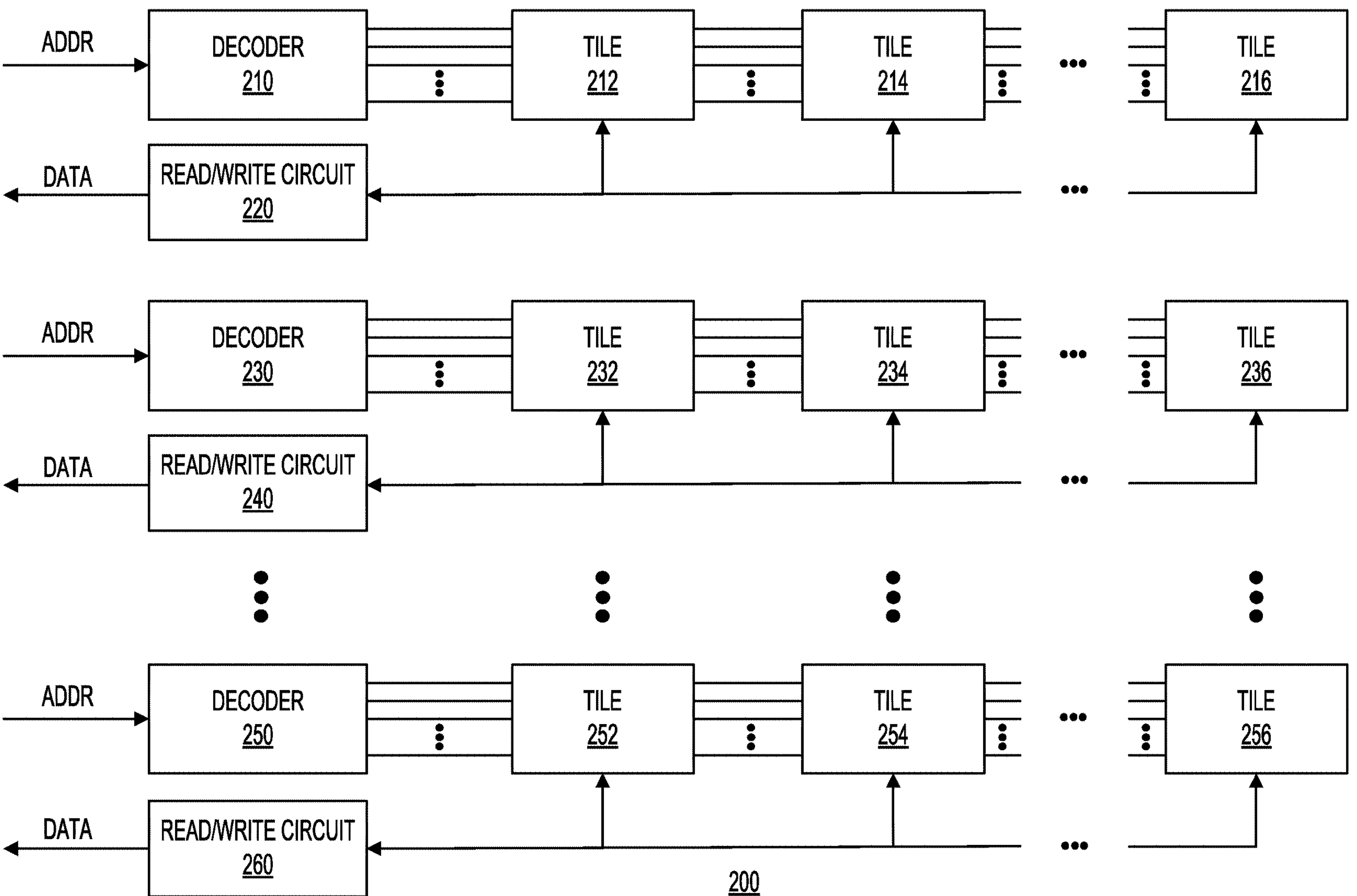
FIG. 2 shows a diagram of a bank of a memory in accordance with one example.

FIG. 2 shows a diagram of a bank 200 of a memory (e.g., memory 150 of FIG. 1) in accordance with one example. In this example, bank 200 may include a number of decoders and a number of tiles organized in rows and columns. Address bits received as part of the address may be used to select a bank of the memory and additional address bits may be used to select a row in the bank at issue. Each tile may include a number of memory cells, such that each memory cell may store a unit of data (e.g., a logical bit value 0/1). Data signals may be provided to, or received from, bank 200 using DATA busses and address signals may be provide to, or received from, bank 200 using ADDR busses. In this example, bank 200 may include decoders 210, 230, and 250.

Bank 200 may further include tiles 212, 214, 216, 232, 234, 236, 252, 254, and 256, which may be organized in the form of an array (e.g., an N by M array, where N is the number of rows in the array and M is the number of columns). Bank 200 may further include read/write circuits 220, 240, and 260.

With continued reference to FIG. 2, in this example, decoder 210 may correspond to the top row of tiles, including tiles 212, 214, and 216, and may be coupled to these tiles via wordlines. Thus, decoder 210 may decode row addresses received via its respective ADDR bus. Although not shown in FIG. 2, bank 200 may further include column decoders to decode column addresses for tiles 212, 214, and 216. Read/write circuits 220, 240, and 260 may be coupled to their respective DATA bus lines. In this example, decoder 230 may correspond to another row of tiles, including tiles 232, 234, and 236, and may be coupled to these tiles via wordlines. Thus, decoder 230 may decode row addresses received via its respective ADDR bus. Although not shown in FIG. 2, bank 200 may further include column decoders to decode column addresses for tiles 232, 234, and 236. In this example, decoder 250 may correspond to bottom most row of tiles of bank 200, including tiles 252, 254, and 256, and may be coupled to these tiles via wordlines. Thus, decoder 250 may decode row addresses received via its respective ADDR bus. Although not shown in FIG. 2, bank 200 may further include column decoders to decode column addresses for tiles 252, 254, and 256.

Still referring to FIG. 2, in one example, the write operation may include an erase operation followed by a program operation. Decoders and read/write circuits may drive the appropriate current for the appropriate amount of time to perform the erase operation and the program operation. Charge pumps may be used to provide the current for the erase operations and the programming operations. The charge pumps may be coupled to clocking circuitry if the pulsed current is used for performing these operations. In one example, read/write circuits may include latches, switches, and other logic to store data temporarily, such that data may written to the tiles or read from the tiles. Read/write circuits and decoders may be controlled using at least one finite state machine (FSM) or similar control logic. As an example, the voltage drivers configured to drive current required to program or erase the non-volatile cells associated with the tiles may be controlled using the FSM or similar control logic. Thus, depending on the type of non-volatile cells and the specifications associated with such cells, the voltage drivers may apply appropriate voltages to the gate, the drain, and/or the source of the memory cells. In addition, the program and erase operations may be performed using latches and voltage driver circuits such that they can proceed autonomously in the background even when the tiles associated with bank 200 are being read. Although FIG. 2 shows a certain number of components of bank 200 arranged in a certain manner, bank 200 may include more or fewer number of components arranged differently.

Figure 3:
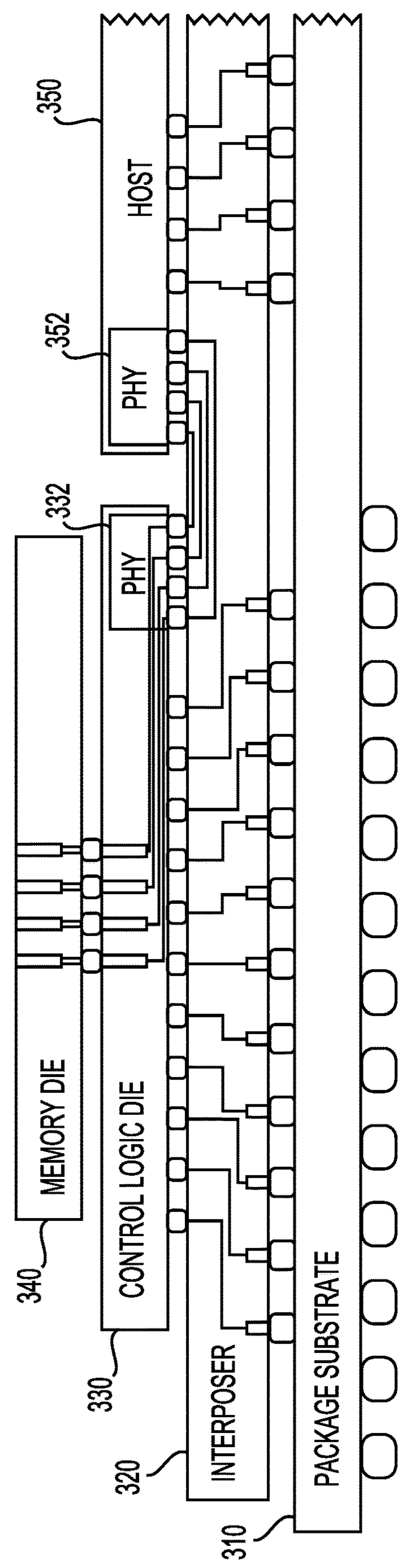
FIG. 3 shows a diagram of a system in accordance with one example.

FIG. 3 shows a diagram of a system 300 in accordance with one example. System 300 may include a package substrate 310 connected to an interposer 320. Interposer 320 may further be connected to a control logic die 330 and a host 350. Control logic die 330 may implement the functionality associated with control logic 130 of FIG. 1. Host 350 may be a graphical processor unit (GPU), a central processing unit (CPU), or a system-on-chip (SOC). Memory die 340 may be stacked on top of control logic die 330. Memory die 340 may implement the functionality associated with memory 150 of FIG. 1. Control logic die 330 may include a component (e.g., PHY 332) and host 350 may also include a similar component (e.g., PHY 352). These components may be used to physically interconnect the two through interposer 320. Control logic die 330 and the stacked memory may be interconnected via micro-bumps and through-silicon vias (TSVs). Although FIG. 3 shows a single memory die 340, system 300 may include multiple stacked memory die. In addition, through a close coupling with control logic die 330, memory die 340 may receive additional commands/instructions. Although FIG. 3 shows a certain number of components of system 300 arranged in a certain manner, there could be more, or fewer number of components arranged differently. As an example, the control logic die and the memory die need not be stacked. Similarly, although FIG. 3 shows an interposer for interconnecting the control logic die, the host, and the memory die, other interconnection arrangements for integrating the logic with the memory may also be used. As an example, these components may be packages that may be mounted on a PCB or another shared substrate. The control logic die and the memory die may be bonded using various bonding techniques. The control logic die and the memory die may also be coupled to each other in other configurations, including package-on-package, system-in-a-package, or other configurations. The host and the memory die may also be packaged side-by-side in a single package substrate.

In one example, system 300 may include bank address terminals, address terminals, address latches, multiplexers (as needed), and input/output terminals. The address information may be used to select a memory location on the chip, including the bank, the tile, and the row/column. The address terminals may be used for both row and column address selection by asserting the row and column addresses in a multiplexed fashion. The number and organization of address terminals may depend on the memory's size and organization.

To explain the operation associated with memory system 120 of FIG. 1, FIG. 4 shows a bank 400 configured to operate in accordance with one example. Bank 400 may include components like bank 200 of FIG. 2. Like bank 200, bank 400 may include a number of tiles organized in an array. In addition, for ease of explanation details shown earlier with respect to FIG. 1 and FIG. 2 have been omitted as part of FIG. 4 and other similar figures that help describe the operation of memory system 120. Each row of tiles may include a corresponding decoder (e.g., any of DEC0, DEC1, or DEC 7). To describe the operation of a bank of the memory (e.g., bank 200), FIG. 4 includes tiles identified by the letter T and row/column number of the tile. Thus, tile T00 is the tile included as part of row 0 and column 0, tile T01 is the tile included as part of row 0 and column 1. For ease of explanation, FIG. 4 shows a bank with 64 tiles; a bank may include a larger number (or a fewer number) of tiles. In terms of operation, bank 400 is configured such that a read operation requires reading of an entire row, but the write operation writes to a single tile in a row. This allows the writing of data to eight different tiles, one per row, thus simultaneously performing eight write operations. As an example, tile T03 in row 0 and column 3, tile T11 in row 1 and column 1, tile T24 in row 2 and column 4, tile T36 in row 3 and column 6, tile T41 in row 4 and column 1, tile T55 in row 5 and column 5, tile T62 in row 6 and column 2, and tile T77 in row 7 and column 7 may be included as part of the single write operation. Note that the specific combination of tiles chosen in FIG. 4 is just an example, other combination of tiles may also be included as part of a single write operation. In this example, the only restriction is that each row has only one tile in the write state during the write operation. There is, however, no restriction on which tile is chosen in each row. Advantageously, in this arrangement of tiles because each tile being written to has its own address decoder associated with the tile row, a different address can be specified for a tile in a different row.

With continued reference to FIG. 4, in one example, each tile is configured to store one or more cache lines (e.g., cache line(s) corresponding to a cache associated with host 110 of FIG. 1). This way, in this example, a single write operation can write eight different cache lines to eight unrelated addresses. To enable simultaneous writing of eight cache lines, the control logic associated with the memory needs to ensure that each of the eight addresses for the eight cache lines maps to a different row of the tiles within a group of eight rows of tiles (e.g., bank 200 of FIG. 2). Although FIG. 4 shows a certain number of components of bank 400 arranged in a certain manner, bank 400 may include more or fewer number of components arranged differently.

Still referring to FIG. 4, to perform the operations described in this example, control logic (e.g., control logic 130 of FIG. 1 or control logic die 330 of FIG. 3) may include a write buffer for each tile-row. In the example shown in FIG. 4, there are 8 rows of tiles, hence the control logic die 330 may include 8 write buffers. As write commands are received from the host (e.g., host 110 or host 350), in one example, the commands are forwarded to the appropriate write buffer, based on a group of three bits within the addresses associated with the write commands. This is because, in this example, there are 8 write buffers (one for each row), and thus three bits are sufficient. Each bank may have its own scheduler (not shown), which may schedule the write commands for execution. Subsequently, control logic associated with each bank may dequeue the data from the eight corresponding write buffers and initiate the write into the column. In one example, data received from the write buffers associated with control logic die 330 may be stored temporarily in data buffers or latches (e.g., data buffers or latches associated with read/write circuits 220, 240, and 260 of FIG. 2) included as part of memory die 340. If one or more of the write buffer(s) is empty, the corresponding tile need not be written. If only one cache line is being written, a read-modify-write may be required, if the minimum unit of data that can be written to the memory is larger than a size of a cache line. This example approach results in the following write performance: (1) eight banks can be writing at the same time (based on power limit); (2) each bank writes eight cache lines; and (3) a write operation may take approximately 1 μs. These operational metrics translate to: (8*8)/1 μs=64 million writes per second.

To ensure proper error detection and correction for an entire cache line that is read from a single tile, error correcting codes (ECC) may be stored in the same tile. An appropriate ECC generator may be used to perform parity-based operations to generate the codes. In this example, the use of ECC will result in an increase of the page size to store the required number of ECC bits and metadata. When a tile is servicing a cache line read, the write buffer may need to be snooped. Otherwise, the read operation may return stale data.

As shown in FIG. 5, if the ability to survive a failure of a tile is required as part of a memory system, then each row of the tiles needs an additional tile. The additional tile would store bitwise parity of the remaining eight tiles. FIG. 5 shows a bank 500 with the additional tiles for parity related operations in accordance with one example. Bank 500 may include all of the decoders and tiles as described with respect to bank 400 of FIG. 4. In addition, bank 500 may include a column that may include an additional tile for each of the rows of tiles. As an example, tile T08 may be included as part of the top row. Similarly, other rows may include the additional tiles T18, T28, T38, T48, T58, T68, and T78. In one example, a page at a given index of tile T08 may be configured to store bitwise parity of the pages at the same index for tiles T01-T07. In this example, in case of a failure of an entire tile or any subset thereof, the data can be re-created with a simple parity calculation. In this example, each group of eight cache line writes requires two column writes, so the write performance may be cut into half. Although FIG. 5 shows a certain number of components of bank 500 arranged in a certain manner, bank 500 may include more or fewer number of components arranged differently.

With continued reference to FIG. 5, in this example, every time a cache line is written, the corresponding pages from the tile row must be read, in order to compute the new parity, which is then written to the parity tile. This means that the parity tile will get eight times as many writes as all the others. This may cause a higher amount of wear to the heavily used memory cells, so a wear leveling mechanism may be required. Wear may be caused because of at least two reasons: (1) it is possible for an application to repeatedly write the same location at a very high frequency (this may be a malicious action); and (2) parity tiles will get eight times as many writes as the other tiles. Wear may be reduced by using techniques that map logical addresses to physical addresses associated with the memory.

As an example, a Start-Gap based mapping between a logical address and a physical address may be used. To implement the Start-Gap technique, an extra row may be added to the memory. The extra row, which may be referred to as the GAP-LINE, includes no useful data. Two internal registers—START and GAP—associated with the control logic of the memory are used as well. The START register initially points to row 0 and the GAP register always points to the row corresponding to the GAP-LINE. To perform wear leveling, the value stored in the register GAP is changed by 1 once every predetermined number of writes, which results in the physical address of the parity bits moving to a different physical address. As an example, the move is accomplished by copying the content of the row corresponding to GAP-1 to the row corresponding to the GAP-LINE and decrementing the value stored in the GAP register. This way, every time the gap moves, a logical address will map to a different physical address. The use of such a technique with the memory system described with respect to the present disclosure lowers the wear caused by repeated writes to the same location at a very high frequency.

In one example, to address the wear caused to the tiles that are used to store parity bits, different locations for storing parity bits may be used. As an example, a modulo operation with respect to the cache line address (e.g., cache line address mod 9) may be used to select which tile in the row of tiles is selected to store the parity bits. This effectively creates a rotating pattern of parity locations for successive addresses as shown with respect to bank 600 in FIG. 6A in accordance with this example. FIG. 6B shows the pattern of parity locations for the next eight addresses for bank 600 in accordance with this example.

In addition, in one example, the choice of the parity location in a row is made dependent on the logical address, not on the physical address. This ensures that every time a physical location gets mapped to a new logical address, the parity location moves to a different tile. This way, over time all locations will be used for parity a roughly equal amount of time and this results in wear leveling.

In certain examples, the memory may be optimized by sharing some of the write circuitry across a group of tiles that are adjacent to each other. As shown in FIG. 7, instead of writing tiles in any combination of eight tiles (one tile per row), the control logic associated with the memory is configured to ensure that all eight tiles are stored in a single column, as shown in FIG. 7. Thus, in this example, in response to a write command from the host, the cache lines are stored in a single column, including tiles T04, T14, T24, T34, T44, T54, T64, and T74. The choice of column is just an example, and thus other columns of tiles may be written to as long as all eight tiles are stored in a single column. The control logic may be configured to support writing of any column at a time. As an example, when selecting writes to complete, the control logic associated with the non-volatile memory may be configured to select eight tiles that all fall in the same column, but in different rows. To accomplish this, a write buffer is provided for every tile, not just for every row of tiles.

In the example architecture of bank 700, the scheduler may select successive columns for writing and unload writes from the corresponding write buffers and complete them. Unlike the previous approach, described earlier with respect to bank 400 of FIG. 4, which requires one write buffer per row of tiles, this approach requires a write buffer for every tile. In addition, the scheduler may require that the parity bits be written in a column, instead of rotating the parity bits in a manner described earlier with respect to FIGS. 6A and 6B. In the example architecture shown in bank 700, wear leveling may be accomplished by periodically changing the column of tiles that is used for storing the parity bits. When such a change is made, data will have to be re-written and the memory system will suffer from reduced performance during that time. To minimize the impact of wear leveling operations, in this example, the column used for parity bits may be changed when the system is experiencing a lower demand—for example at a specific time of the day. Although FIG. 7 shows a certain number of components of bank 700 arranged in a certain manner, bank 700 may include more or fewer number of components arranged differently. As an example, instead of storing the parity data as part of memory 150, the parity data may be stored in an external dynamic random-access memory (DRAM). Because of the DRAM's higher performance with respect to write operations and negligible write endurance issues, the DRAM may be a suitable candidate for storing parity. This example will eliminate the need to rotate the parity across tiles as described above with respect to FIG. 6. The addition of the external DRAM will increase cost of the memory system, but some of the increased cost may be offset by the reduced costs associated with memory 150, not including an additional parity tile per row. While any type of DRAM may be used, a DRAM with built-in ECC may be better for storing parity bits.

As described earlier, when a tile is being written to (e.g., programmed or erased), it cannot simultaneously be read. This means that reads that get stuck behind a write may experience significant tail latency. Since certain architectures of the memory may be write-bandwidth constrained, the memory may be configured such that it executes writes at close to full performance, at least during busy periods. Even executing write at close to the full performance may mean that eight out of the 32 banks will be busy writing. Therefore, at least one in four read operations is likely to experience tail latency.

One example architecture, associated with a memory of the present disclosure, is configured to allow reading of the rest of the tiles in a row of tiles while a tile that is in the same row of tiles is being written. As an example, bank 800 of FIG. 8 shows the reading of the other tiles (e.g., tiles T30, T31, T32, T33, T35, T36, T37, and T38) being read while tile T34 is being written. In this example, during the write operation to tile T34, tile T34 is not being read. With continued reference to FIG. 8, since, in this example, tile T38 stores the parity, the data for tile T34 can be reconstructed. This way, the data from the entire row of tiles is available in response to a read command from the host. Thus, in this example, the read operation can be completed with similar latency as the latency incurred by a read operation when no write operations are being performed with respect to the row of tiles being read. In one example, logic circuits including exclusive-OR (XOR) gates may be used to reconstruct the data for tile T34. As an example, assuming data D34 corresponds to the data in tile T34 and assuming parity bits LP are stored in tile T38, then the following equation, when implementing using XOR gates and other logic circuits, may be used to reconstruct data $D34=D30\oplus D31\oplus D32\oplus D33\oplus D35\oplus D36\oplus D37\oplus LP$. In this example, the addition of logic circuits for performing the XOR logic operations may introduce additional latency during the performance of the read command. In one example, the control logic associated with bank 800 may be configured such that all read commands experience the same amount of latency. As an example, control circuits may be configured to introduce a delay commensurate with the amount of latency introduced by the XOR logic operations for reading a row of tiles that did not require the reconstruction of a tile. Other changes to the circuits may also be made to ensure consistent timing of read/write operations. Although FIG. 8 shows a certain number of components of bank 800 arranged in a certain manner, bank 800 may include more or fewer number of components arranged differently.

Still referring to FIG. 8, in example bank 800, although the decoder labeled as DEC3 is needed both for read and write operations, the read address and the write address are not the same. Thus, in this example, when the write operation is initiated, the result of the row decode may be stored in a latch corresponding to tile T34, such that a subsequent read can use the decoder labeled as DEC3 without disturbing the ongoing write operation. In this example, this means that the wordlines driven by the decoder labeled as DEC3 cannot be used directly inside the tile, instead the read operation may need go through a latch and voltage driver circuitry and then be driven on a separate set of wordlines. Consequently, in this example, bank 800 may require two sets of wordlines that will be routed over the tile(s). In one example, the two sets of wordlines may include the global wordlines that are shared across the tiles in a row of tiles (e.g., the wordlines connecting the decoders and the tiles in FIG. 2) and local wordlines that are used internally, only. Depending on the other constraints on the design, the addition of local wordlines may or may not cause memory die size to increase. If the increase in the die size is small, duplicated wordlines and latches may be used. In one example, during semiconductor manufacturing, the global wordlines may be formed in a different metal layer from the metal layer used to form the local word lines. The latches and the other voltage driver circuitry may be formed using semiconductor processing techniques. In case the duplication of wordlines and latches is prohibitively expensive, another approach may be used.

As an example, FIG. 9 shows bank 900, which includes decoders on both sides of the rows of tiles. There is a second column of decoders on the other side of the tile row. As an example, the top row of tiles includes decoder DEC0 on the left side and decoder DEC0A on the right side. In one example, each of the decoders for a row (e.g., DEC0 and DEC0A) decodes the same address as the other decoder and drives the address on the same wordlines. In this example, additional circuitry (e.g., circuitry 902, 904, 906, 908, 910, 912, 914, and 916) is arranged between the gaps among the tiles. In this example, the circuitry arranged in each gap has two functions: (1) the ability to selectively sever the connection to the wordline and (2) to selectively latch the state of the wordline and drive just the local tile with the latched state. In one example, circuity 902, 904, 906, 908, 910, 912, 914, and 916 may include flip-flops to latch the state of the word line.

With continued reference to FIG. 9, in order to initiate the writing of data in tile T34, the address for this tile may be driven by the two decoders corresponding to this row of tiles (e.g., DEC3 and DEC3A shown in FIG. 9). The circuitry between tiles T34 and T35 may sever the connection, so that the two decoders (e.g., DEC3 and DEC3A) are not attempting to drive addresses on the shared wordlines at the same time. In addition, the circuitry between tiles T33 and T34 may include circuitry, such as latches to latch the wordline decode. Subsequently, the circuitry between tiles T33 and T34 may sever the connection to the decoder labeled as DEC3 and drive the decoder selection to the wordlines for the tile T34, at the appropriate write voltage(s). Since, in this example, the connections are severed on both sides of tile T34, this voltage is restricted to tile T34.

Still referring to FIG. 9, while the write operation is being performed with respect to tile T34, the control logic associated with the memory system may initiate a read operation by driving the address from both decoders DEC3 and DEC3A. In this example, decoder DEC3 may drive tiles T30, T31, T32, and T33 and decoder DEC3A may drive tiles T35, T36, T37, and T38. This allows the reading of all tiles except T34 in the row of tiles being accessed, including the reading of tiles T30, T31, T32, T33, T35, T36, T37, and T38 in response to a read command from the host. As described before, with respect to FIG. 8, the data from tile T34 may be reconstructed by using XOR logic gates in a similar fashion. Using the decoders on each side of the rows of tiles, similar read/write operations may be performed with respect to any of the rows of tiles shown as part of bank 900.

Although the architecture of bank 900 allows read operations and writes operations to occur simultaneously, in this example, the operations may not be initiated at the same instant in time. This is because, since the same decoder is used to decode the address for both the read operation and the write operation, only one operation can be initiated at a time. In one example, when initiating a read operation or a write operation, the decoder selection is latched to allow that operation to continue, while another operation is initiated with a new decoder selection. Although FIG. 9 shows a certain number of components of bank 900 arranged in a certain manner, bank 900 may include more or fewer number of components arranged differently. Although the architecture and operations associated with memory systems described herein are explained with respect to banks, the memory system need not include any banks. Instead, the tiles may be organized in an array of rows and columns. The arrays of tiles may be organized into groups similar to banks or not.

Figure 10:
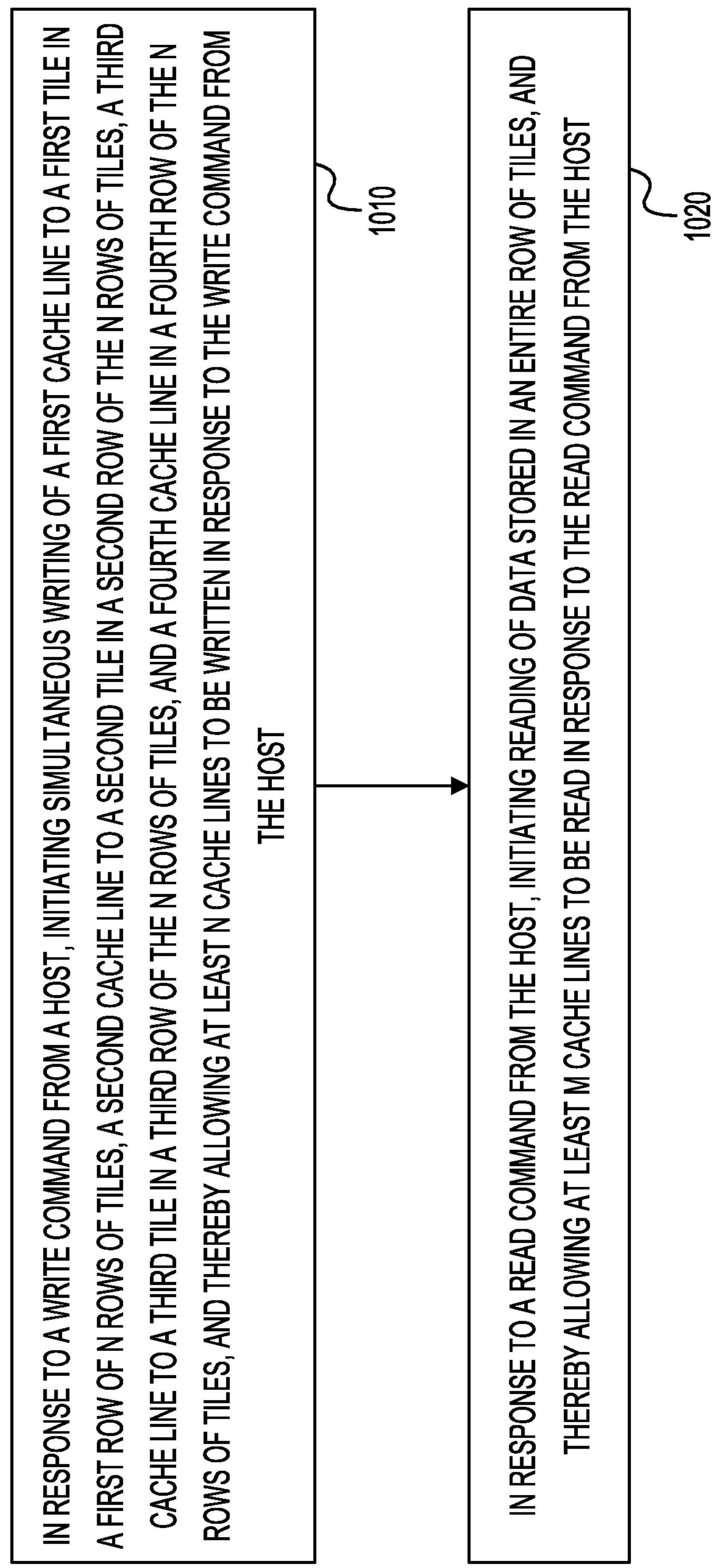
FIG. 10 shows a flow chart of a method associated with a memory system in accordance with one example.

FIG. 10 shows a flow chart 1000 of a method in accordance with one example. In one example, the steps described in this method may be performed by the control logic associated with the memory system. As an example, control logic 130 of FIG. 1 and other circuitry associated with memory 150 may be used to perform these steps. Step 1010 may include in response to a write command from a host, initiating simultaneous writing of a first cache line to a first tile in a first row of the N rows of tiles, a second cache line to a second tile in a second row of the N rows of tiles, a third cache line to a third tile in a third row of the N rows of tiles, and a fourth cache line in a fourth row of the N rows of tiles, and thereby allowing at least N cache lines to be written in response to the write command from the host. As an example, the write operation as part of this step may include writing tiles as shown in bank 400 of FIG. 4. Thus, as explained earlier, a single cache line write command from the host (e.g., host 110 of FIG. 1) may result in tile T03 in row 0 and column 3, tile T11 in row 1 and column 1, tile T24 in row 2 and column 4, tile T36 in row 3 and column 6, tile T41 in row 4 and column 1, tile T55 in row 5 and column 5, tile T62 in row 6 and column 2, and tile T77 in row 7 and column 7 being written.

Step 1020 may include in response to a read command from the host, initiating reading of data stored in an entire row of tiles, and thereby allowing at least M cache lines to be read in response to the read command from the host. Thus, as explained earlier, with respect to FIG. 4, any of the rows of tiles that is not being written to may be read. As an example, assuming tile T03 is not being written, a cache line read command from the host (e.g., host 110 of FIG. 1) may result in all cache lines stored in that row being read.

Figure 11:
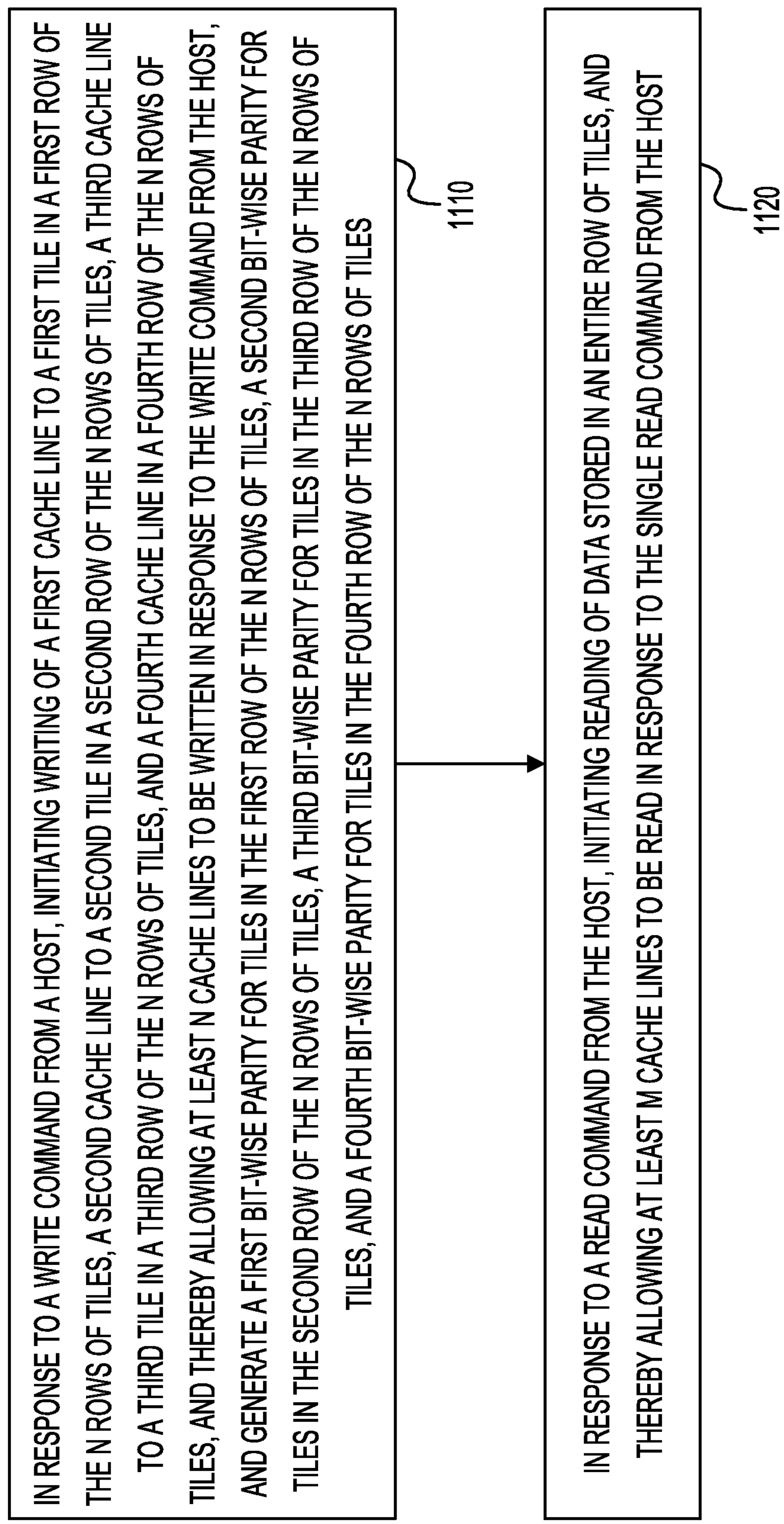
FIG. 11 shows a flow chart of another method associated with a memory system in accordance with one example.

FIG. 11 shows a flow chart 1100 of a method associated with a memory system in accordance with one example. In one example, the steps described in this method may be performed by the control logic associated with the memory system. As an example, control logic 130 of FIG. 1 and other circuitry associated with memory 150 may be used to perform these steps. Step 1110 may include in response to a write command from the host, initiating writing of a first cache line to a first tile in a first row of the N rows of tiles, a second cache line to a second tile in a second row of the N rows of tiles, a third cache line to a third tile in a third row of the N rows of tiles, and a fourth cache line in a fourth row of the N rows of tiles, and thereby allowing at least N cache lines to be written in response to the write command from the host, and generate a first bit-wise parity for tiles in the first row of the N rows of tiles, a second bit-wise parity for tiles in the second row of the N rows of tiles, a third bit-wise parity for tiles in the third row of the N rows of tiles, and a fourth bit-wise parity for tiles in the fourth row of the N rows of tiles. As an example, the write operation as part of this step may include writing tiles as shown in bank 400 of FIG. 4. Thus, as explained earlier, a cache line write command from the host (e.g., host 110 of FIG. 1) may result in tile T03 in row 0 and column 3, tile T11 in row 1 and column 1, tile T24 in row 2 and column 4, tile T36 in row 3 and column 6, tile T41 in row 4 and column 1, tile T55 in row 5 and column 5, tile T62 in row 6 and column 2, and tile T77 in row 7 and column 7 being written. In addition, as explained earlier with respect to bank 500 of FIG. 5, parity bits may be stored in an additional column of tiles after the parity is calculated using a parity generator or an ECC engine. As an example, as shown as part of bank 500 of FIG. 5, parity bits may be generated and then stored in tiles T08, T18, T28, T38, T48, T58, T68, and T78. As explained earlier the generated parity bits may be stored in a rotating pattern, such as explained earlier with respect to bank 600 shown in FIGS. 6A and 6B. Finally, in another example, the generated parity bits may be stored in an external DRAM.

Step 1120 may include in response to a read command from the host, initiating reading of data stored in an entire row of tiles, and thereby allowing at least M cache lines to be read in response to the read command from the host. Thus, as explained earlier, with respect to FIG. 4, any of the rows of tiles that is not being written to may be read. As an example, assuming tile T03 is not being written, a cache line read command from the host (e.g., host 110 of FIG. 1) may result in all cache lines stored in that row being read.

Figure 12:
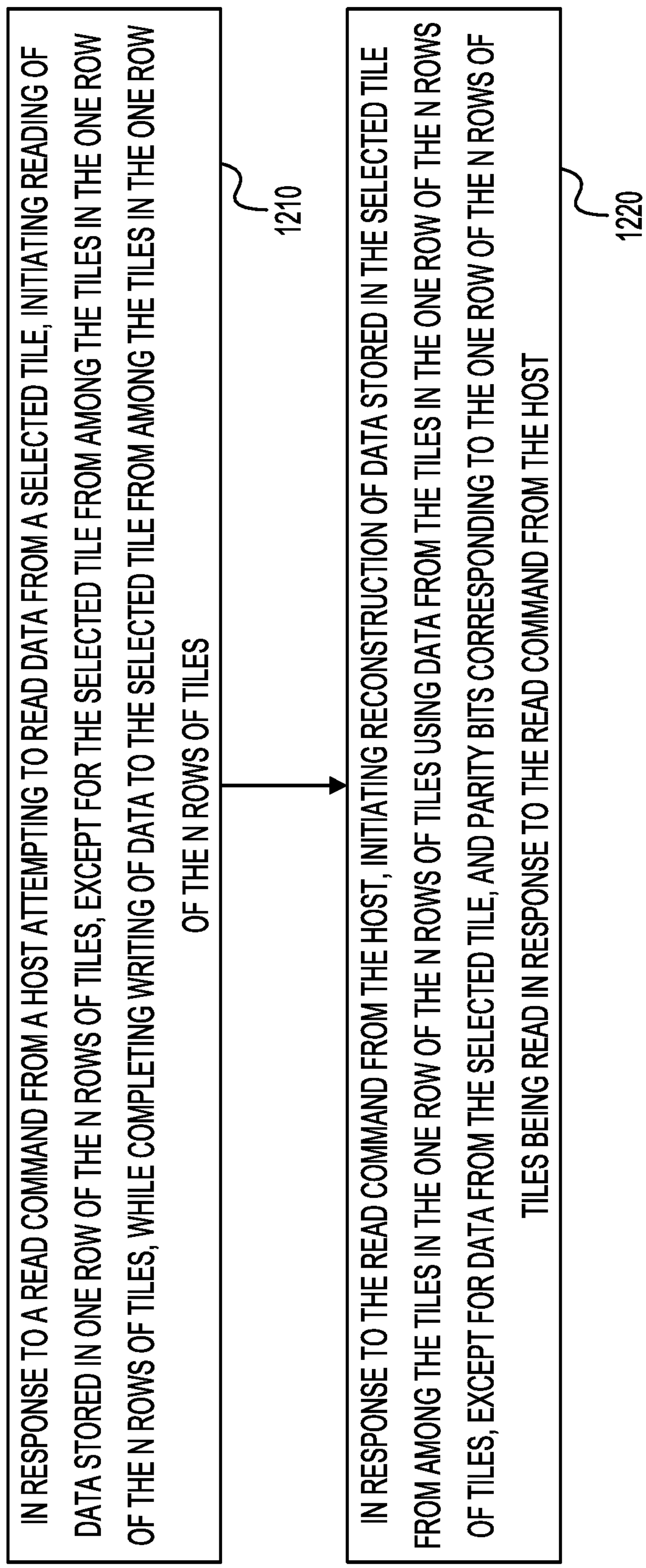
FIG. 12 shows a flow chart of yet another method associated with a memory system in accordance with one example.

FIG. 12 shows a flow chart 1200 of a method associated with a memory system in accordance with one example. In one example, the steps described in this method may be performed by the control logic associated with the memory system. As an example, control logic 130 of FIG. 1 and other circuitry associated with memory 150 may be used to perform these steps. Step 1210 may include in response to a read command from the host attempting to read data from a selected tile, initiating reading of data stored in one row of the N rows of tiles, except for the selected tile from among the tiles in the one row of the N rows of tiles, while completing writing of data to the selected tile from among the tiles in the one row of the N rows of tiles. As an example, the read operation as part of this step may include reading tiles as shown in bank 800 of FIG. 8. Thus, as explained earlier, a cache line read command from the host (e.g., host 110 of FIG. 1) may result in tiles T30, T31, T32, T33, T35, T36, T37, and T38 being read.

Step 1220 may include in response to the read command from the host, initiating reconstruction of data stored in the selected tile from among the tiles in the one row of the N rows of tiles using data from the tiles in the one row of the N row of tiles, except for data from the selected tile, and parity bits corresponding to the one row of the N rows of tiles being read in response to the read command from the host. As an example, bank 800 of FIG. 8 shows the reading of the other tiles (e.g., tiles T30, T31, T32, T33, T35, T36, T37, and T38) being read while tile T34 is being written. As explained earlier with respect to bank 800 of FIG. 8, during the write operation to tile T34, tile T34 is not being read. With continued reference to FIG. 8, since tile T38 stores the parity, the data for tile T34 can be reconstructed. This way, the data from the entire row of tiles is available in response to a read command from the host. As explained earlier, logic circuits including exclusive-OR (XOR) gates may be used to reconstruct the data for tile T34. As an example, assuming data D34 corresponds to the data in tile T34 and assuming parity bits LP are stored in tile T38, then the following equation, when implementing using XOR gates and other logic circuits, may be used to reconstruct data $D34=D30\oplus D31\oplus D32\oplus D33\oplus D35\oplus D36\oplus D37\oplus LP$.

In conclusion, the present disclosure relates to a memory system including at least one array of N rows of tiles and M columns of tiles, where each of N and M is an integer, where each of the tiles is configured to store data corresponding to at least one cache line associated with a host, and where each of the tiles comprises memory cells. The memory system may further include control logic.

The control logic may be configured to, in response to a write command from a host, initiate writing of a first cache line to a first tile in a first row of the N rows of tiles, a second cache line to a second tile in a second row of the N rows of tiles, a third cache line to a third tile in a third row of the N rows of tiles, and a fourth cache line in a fourth row of the N rows of tiles, and thereby allowing at least N cache lines to be written in response to the write command from the host. The control logic may further be configured to, in response to a read command from the host, initiate reading of data stored in an entire row of tiles, and thereby allowing at least M cache lines to be read in response to the read command from the host.

In the memory system, the first tile, the second tile, the third tile, and the fourth tile do not share a column. The memory system may further comprise an additional column of tiles, where the additional column of tiles is configured to store parity bits. The selection of a location of a tile in a row of tiles to store the parity bits may be based on a logical address associated with the location of the tile.

The control logic may further be configured to map a logical address associated with a cache line to a physical address associated with the cache line in a manner to reduce wear caused by repeated writing of memory cells associated with tiles. The memory system may further comprise N decoders, where each decoder corresponds to a respective row of the N rows of tiles.

In another example, the present disclosure relates to a memory system. The memory system may include at least one array of N rows of tiles and M columns of tiles, where each of N and M is an integer, where each of the tiles is configured to store data corresponding to at least one cache line associated with a host, and where each of the tiles comprises non-volatile memory cells. The memory system may further include control logic.

The control logic may be configured to, in response to a write command from the host, initiate writing of a first cache line to a first tile in a first row of the N rows of tiles, a second cache line to a second tile in a second row of the N rows of tiles, a third cache line to a third tile in a third row of the N rows of tiles, and a fourth cache line in a fourth row of the N rows of tiles, and thereby allowing at least N cache lines to be written in response to the write command from the host, and generate a first bit-wise parity for tiles in the first row of the N rows of tiles, a second bit-wise parity for tiles in the second row of the N rows of tiles, a third bit-wise parity for tiles in the third row of the N rows of tiles, and a fourth bit-wise parity for tiles in the fourth row of the N rows of tiles. The control logic may further be configured to, in response to a read command from the host, initiate reading of data stored in an entire row of tiles, and thereby allowing at least M cache lines to be read in response to the read command from the host.

In the memory system, the first tile, the second tile, the third tile, and the fourth tile do not share a column. In another example, in the memory system, the first tile, the second tile, the third tile, and the fourth tile share a column.

The parity bits corresponding to the first bit-wise parity, the second bit-wise parity, the third bit-wise parity, and the fourth bit-wise parity may be stored in a separate memory. The parity bits corresponding to the first bit-wise parity, the second bit-wise parity, the third bit-wise parity, and the fourth bit-wise parity may be stored in tiles. The control logic may further be configured to map a logical address associated with a cache line to a physical address associated with the cache line in a manner to reduce wear caused by repeated writing of memory cells associated with tiles.

In yet another example, the present disclosure relates to a memory system. The memory system may include at least one array of N rows of tiles and M columns of tiles, where each of N and M is an integer, where each of the tiles is configured to store data corresponding to at least one cache line associated with a host, and where each of the tiles comprises non-volatile memory cells. The memory system may further include control logic.

The control logic may be configured to, in response to a read command from the host attempting to read data from a selected tile, initiate reading of data stored in one row of the N rows of tiles, except for the selected tile from among the tiles in the one row of the N rows of tiles, while completing writing of data to the selected tile from among the tiles in the one row of the N rows of tiles. The control logic may further be configured to, in response to the read command from the host, initiate reconstruction of data stored in the selected tile from among the tiles in the one row of the N rows of tiles using data from the tiles in the one row of the N rows of tiles, except for data from the selected tile, and the parity bits corresponding to the one row of the N rows of tiles being read in response to the read command from the host.

The memory system may further include a first set of voltage driver circuits and latches coupled to a set of global wordlines and a second set of voltage driver circuits and latches coupled to a set of local wordlines. The memory system may further include circuitry configured to latch, in one of the latches, a state of any global wordlines associated with the selected tile from among the tiles in the one of N rows of tiles, sever a connection with the global wordlines, and drive, using one of the voltage driver circuits, any local wordlines associated with the selected tile from among the tiles in the one of N rows of tiles.

The memory system may include K decoders, where K is an integer multiple of N, and where at least two decoders from among the K decoders correspond to a respective row of the N rows of tiles. The at least the selected tile from among the tiles in the one of N rows of tiles may be coupled to a set of global wordlines shared across at least the tiles in the one of the N rows of tiles and a set of local wordlines for use with the selected tile from among the tiles in the one of N rows of tiles. The memory system may further include a first set of voltage driver circuits and latches coupled to the set of global wordlines and a second set of voltage driver circuits and latches coupled to the set of local wordlines.

It is to be understood that the methods, modules, and components depicted herein are merely exemplary. Alternatively, or in addition, the functionality described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with some examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid-state drive, a magnetic disk or tape, an optical disk or tape, a flash memory, an EPROM, NVRAM, PRAM, or other such media, or networked versions of such media. Volatile media include, for example, dynamic memory such as DRAM, SRAM, a cache, or other such media. Non-transitory media is distinct from but can be used in conjunction with transmission media. Transmission media is used for transferring data and/or instruction to or from a machine. Exemplary transmission media include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into an operation, and/or the functionality of an operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A method for operating a memory system comprising at least one array of N rows of tiles and M columns of tiles, wherein each of N and M is an integer, wherein each of the tiles is configured to store data corresponding to at least one cache line associated with a host, and wherein each of the tiles comprises memory cells, the method comprising:

in response to a write command from a host, initiating writing of a first cache line to a first tile in a first row of the N rows of tiles, a second cache line to a second tile in a second row of the N rows of tiles, a third cache line to a third tile in a third row of the N rows of tiles, and a fourth cache line in a fourth row of the N rows of tiles, and having at least N cache lines to be written in response to the write command from the host; and in response to a read command from the host, initiating reading of data stored in an entire row of tiles, and haying at least M cache lines to be read in response to the read command from the host.

2. The method of claim 1, wherein the first tile, the second tile, the third tile, and the fourth tile do not share a column.

3. The method of claim 1, wherein the memory system further comprises an additional column of tiles, wherein the additional column of tiles is configured to store parity bits.

4. The method of claim 3, wherein a selection of a location of a tile in a row of tiles to store the parity bits is based on a logical address associated with the location of the tile.

5. The method of claim 1, further comprising mapping a logical address associated with a cache line to a physical address associated with the cache line in a manner to reduce wear caused by repeated writing of memory cells associated with the tiles.

6. The method of claim 1, wherein the memory system further comprises N decoders, wherein each decoder corresponds to a respective row of the N rows of tiles.

7. A method for operating a memory system comprising at least one array of N rows of tiles and M columns of tiles, wherein each of N and M is an integer, wherein each of the tiles is configured to store data corresponding to at least one cache line associated with a host, and wherein each of the tiles comprises memory cells, the method comprising:

in response to a write command from the host, initiating writing of a first cache line to a first tile in a first row of the N rows of tiles, a second cache line to a second tile in a second row of the N rows of tiles, a third cache line to a third tile in a third row of the N rows of tiles, and a fourth cache line in a fourth row of the N rows of tiles, and having at least N cache lines to be written in response to the write command from the host, and generate a first bit-wise parity for tiles in the first row of the N rows of tiles, a second bit-wise parity for tiles in the second row of the N rows of tiles, a third bit-wise parity for tiles in the third row of the N rows of tiles, and a fourth bit-wise parity for tiles in the fourth row of the N rows of tiles; and in response to a read command from the host, initiating reading of data stored in an entire row of tiles, and having at least M cache lines to be read in response to the read command from the host.

8. The method of claim 7, wherein the first tile, the second tile, the third tile, and the fourth tile do not share a column.

9. The method of claim 7, wherein the first tile, the second tile, the third tile, and the fourth tile share a column.

10. The method of claim 7, wherein the parity bits corresponding to the first bit-wise parity, the second bit-wise parity, the third bit-wise parity, and the fourth bit-wise parity are stored in a separate memory.

11. The method of claim 7, wherein the parity bits corresponding to the first bit-wise parity, the second bit-wise parity, the third bit-wise parity, and the fourth bit-wise parity are stored in tiles.

12. The method of claim 7, further comprising mapping a logical address associated with a cache line to a physical address associated with the cache line in a manner to reduce wear caused by repeated writing of memory cells associated with the tiles.

13. A method for operating a memory system comprising at least one array of N rows of tiles and M columns of tiles, wherein each of N and M is an integer, wherein each of the tiles is configured to store data corresponding to at least one cache line associated with a host, and wherein each of the tiles comprises memory cells, the method comprising:

in response to a read command from the host attempting to read data from a selected tile, initiating reading of data stored in one row of the N rows of tiles, except for the selected tile from among the tiles in the one row of the N rows of tiles, while completing writing of data to the selected tile from among the tiles in the one row of the N rows of tiles; and in response to the read command from the host, initiating reconstruction of data stored in the selected tile from among the tiles in the one row of the N rows of tiles using data from the tiles in the one row of the N rows of tiles, except for data from the selected tile, and parity bits corresponding to the one row of the N rows of tiles being read in response to the read command from the host.

14. The method of claim 13, wherein the memory system further comprises N×M decoders, and wherein each decoder corresponds to a respective tile.

15. The method of claim 14, wherein at least the selected tile from among the tiles in the one of N rows of tiles is coupled to a set of global wordlines shared across at least the tiles in the one of the N rows of tiles and a set of local wordlines for use with the selected tile from among the tiles in the one of N rows of tiles.

16. The method of claim 13, wherein the memory system further comprises a first set of voltage driver circuits and latches coupled to a set of global wordlines and a second set of voltage driver circuits and latches coupled to a set of local wordlines.

17. The method of claim 16, wherein the memory system further comprises circuitry configured to latch, in one of the latches, a state of any global wordlines associated with the selected tile from among the tiles in the one of N rows of tiles, sever a connection with the global wordlines, and drive, using one of the voltage driver circuits, any local wordlines associated with the selected tile from among the tiles in the one of N rows of tiles.

18. The method of claim 13, wherein the memory system further comprises K decoders, wherein K is an integer multiple of N, and wherein at least two decoders from among the K decoders correspond to a respective row of the N rows of tiles.

19. The method of claim 18, wherein at least the selected tile from among the tiles in the one of N rows of tiles is coupled to a set of global wordlines shared across at least the tiles in the one of the N rows of tiles and a set of local wordlines for use with the selected tile from among the tiles in the one of N rows of tiles.

20. The method of claim 18, wherein the memory system further comprises a first set of voltage driver circuits and latches coupled to a set of global wordlines and a second set of voltage driver circuits and latches coupled to a set of local wordlines.

* * * * *